United States Patent
Nyholm et al.

(10) Patent No.: US 7,291,380 B2
(45) Date of Patent: Nov. 6, 2007

(54) LASER ENHANCED PLATING FOR FORMING WIRING PATTERNS

(75) Inventors: Peter S. Nyholm, Austin, TX (US); Curt Lee Nelson, Corvallis, OR (US); Niranjan Thirukkovalur, Corvallis, OR (US); Paul McClelland, Monmouth, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 58 days.

(21) Appl. No.: 10/888,450

(22) Filed: Jul. 9, 2004

(65) Prior Publication Data

US 2006/0008627 A1    Jan. 12, 2006

(51) Int. Cl.
*B32B 3/00* (2006.01)
*H05K 1/02* (2006.01)
*B05D 1/36* (2006.01)

(52) U.S. Cl. .......... 428/209; 428/344; 428/901; 174/257; 174/258; 174/259; 427/125; 427/404; 427/407.1; 427/419.1

(58) Field of Classification Search ........ 428/209, 428/901, 344; 174/250–259; 427/125, 407, 427/404, 419
See application file for complete search history.

(56) References Cited

U.S. PATENT DOCUMENTS

| | | | |
|---|---|---|---|
| 4,080,513 A * | 3/1978 | Cuneo et al. ............ 174/255 |
| 4,694,302 A | 9/1987 | Hackleman et al. .......... 347/96 |
| 4,711,822 A * | 12/1987 | Choyke et al. ............. 428/458 |
| 5,114,744 A | 5/1992 | Cloutier et al. ............... 427/96 |
| 5,358,604 A | 10/1994 | Lin et al. |
| 6,156,413 A * | 12/2000 | Tomari et al. .............. 428/209 |
| 6,265,075 B1 * | 7/2001 | Klueppel et al. ............ 428/418 |
| 6,319,564 B1 | 11/2001 | Naundorf et al. ........... 427/531 |
| 6,515,233 B1 * | 2/2003 | Labzentis et al. ........... 174/254 |
| 6,730,857 B2 * | 5/2004 | Konrad et al. .............. 174/257 |
| 6,742,250 B2 * | 6/2004 | Takahashi .................... 29/847 |
| 6,919,514 B2 * | 7/2005 | Konrad et al. .............. 174/258 |
| 2002/0076497 A1 | 6/2002 | Chen |

FOREIGN PATENT DOCUMENTS

| | | |
|---|---|---|
| DE | 19723734 | 12/1998 |
| EP | 0 260 514 | 3/1988 |
| EP | 327399 | 8/1989 |
| EP | EP0260514 | 6/1991 |

OTHER PUBLICATIONS

Concepcion, Arlene, "Electroless deposition of metals on paper using line patterning", *Proceedings of the National Conference on Undergraduate Research (NCUR )*, University of Wisconsin, Whitewater, (Apr. 25-27, 2002),1-5.

Fuller, Sawyer B., et al., "Ink-jet printed nanoparticle microelectromechanical systems", *Journal of Microelectromechanical Systems*, 11(1), (Feb. 2002),54-60.

(Continued)

*Primary Examiner*—Cathy F. Lam

(57) ABSTRACT

A method of plating a substrate including coating a substrate surface, laser-treating a region of the coated surface, and plating the region.

8 Claims, 9 Drawing Sheets

OTHER PUBLICATIONS

Gilleo, Ken, "Circuits Unusual: Time to Bring Back 3D Molded Circuits?", http://www.circuitree.com/CDA/ArticleInformation/features/BNP_Features_Item/0,2133,106285,00.html, (Sep. 1, 2003),Website Article.

Huske, M, et al., "Laser supported activation and additive metallization of thermoplastics for 3D-MIDS",*Proceedings of the 3rd LANE 2001*, (Aug. 28-31, 2001),1-12.

Jacobs, Heiko O., et al., "Approaching Nanoxerography: The Use of Electrostatic Forces to Position Nanoparticles with 100 nm Scale Resolution", *Advanced Materials*, 14(21),(Nov. 2002),1553-1557.

Kaydanova, Tanya, et al., "Ink Jet Printing Approaches to Solar Cell Contacts", *NCPV and Solar Program Review Meeting 2003*, NREL/CD-520-33586, p. 919,(2003),1-3.

LPKF Laser & Electronics, "LPKF MicroLine 3D IR Industrial", http://www.lpkfusa.com/datasheets/mid/ml3d.pdf, Website—2 pages.

LPKF Laser & Electronics, "LPKF-LDS Process Description—Data Sheet", http://www.lpkfusa.com/datasheets/mid/lds.pdf, Website—1-4.

Max Levy Online, "Flex Circuits and Metalized Film: Bulletin 1370A", http://www.maxlevy.com/Bulletin1370Ap.cfm, Website Article.

Photonics Tech Briefs Online, "Miniaturization of Electronic Components:", http://www.ptbmagazine.com/content/102002_lpkf.html. (Oct. 2002),Website Article.

Yang, H, et al., "Excimer laser-induced formation of metallic microstructures by electroless copper plating", *Journal of micromechanics and microengineering*, 12(2), (Mar. 2002),157-161.

* cited by examiner

LASER ENHANCED PLATING FOR FORMING WIRING PATTERNS

BACKGROUND

Plated substrates often include unwanted metal deposition in regions other than conductive trace regions.

DETAILED DESCRIPTION

Figure 1A:
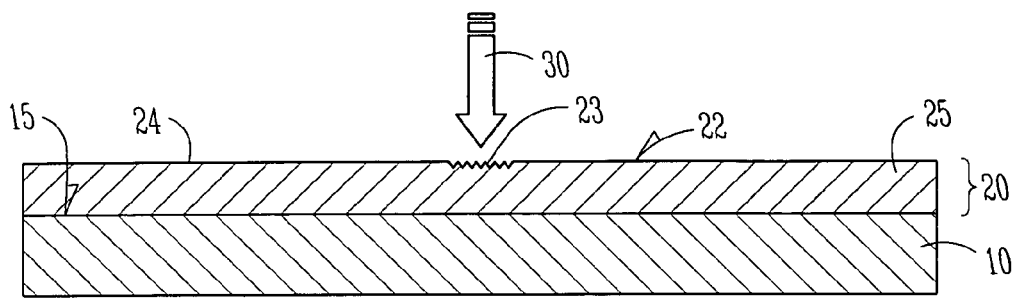
FIG. 1A is a cross-sectional view illustrating laser-treatment of a substrate in an embodiment.

FIG. 1A is a cross-sectional view illustrating laser-treatment of a substrate 10 in an embodiment. In an embodiment, the substrate 10 has a surface 15. Supported by the surface 15 is a surface coating 20, in an embodiment. In an embodiment, the surface coating is a plating enhancing layer 20. In other embodiment, the plating enhancing layer 20 is coated on, applied to, deposited onto, and/or dispensed onto the substrate 10, depending upon the materials used and the application for which the substrate is used.

The plating enhancing layer 20 has a surface 22 with a first region 23 and a second region 24, in an embodiment. In an embodiment, a conductive trace 60 (shown in FIG. 1B) or a metal trace is supported by the plating enhancing layer 20 at the first region 23 (or supported by the substrate if the plating enhancing layer is later removed), as discussed herein. As shown in FIG. 1A, the first region 23 at the surface 22 is roughened, in an embodiment. In an embodiment, the first region 23 is roughened through laser-treatment with a laser beam 30. In an embodiment, there is a means for roughening the first region 23 of the coated surface. In an embodiment, the means for roughening the first region of the coated surface includes laser-treating the first region.

In an embodiment, the substrate 10 is about 10 microns thick to about 125 microns thick, depending upon the application for which the substrate is used. In embodiments, the substrate is at least one of a polymer, KAPTON a polyimide, a liquid crystal polymer (LCP), a glass filled LCP, a polymer, metallic, silicon, a ceramic material, a material having a propensity to adhesion of electroless (chemical) plating in the range of being substantially adhesive to electroless plating without any laser treatment to being substantially non-plateable after laser treatment, and printed organics, depending upon the application for which the substrate is used.

In embodiments, the plating enhancing layer 20 is at least one of substantially non-wetting, substantially smooth, substantially defect-free, substantially attractive to the coating bath metal, substantially resistant to peeling by the trace, substantially adherent to an underlying surface, substrate, basecoat or non-wetting layer, substantially inexpensive, a substantially attractive color, transparent, a material with substantially long term environmental stability, a material with a substantially similar thermal coefficient of expansion as compared with adjacent materials, a material with a thermal coefficient of expansion that is about half way between a thermal coefficient of expansion for materials that are adjacent the plating enhancing layer, and substantially chemically compatible with adjacent surfaces and an external environment.

In a more particular embodiment, the plating enhancing layer 20 includes a non-wetting layer shown as 25 in FIG. 1A. In an embodiment, the plating enhancing layer 20 is non-plateable. In an embodiment, the plating enhancing layer 20 does not substantially adhere to a metallic surface. In an embodiment, the plating enhancing layer is plateable. In other embodiments, the layer 20 is plateable in regions, such as region 23, where laser-treated.

In an embodiment, the non-wetting layer 25 includes at least one of a fluoropolymer, poly(para-xylylene), Parylene, TEFLON a fluoropolymer or another non-wetting polymer. In an embodiment, the non-wetting layer is a plasma-deposited thin film layer, although alternative methods of depositions are within the purview of one skilled in the art, depending upon the material used and the application. In an embodiment, the thickness of the non-wetting layer 25 is in a range of about 0.1 micron to about 100 micron. In a particular embodiment, the range is about 0.1 micron to about 25 micron. In a more particular embodiment, the range is about 0.5 to about 5 micron.

In an embodiment, before the first region 23 is laser-treated, the surface 22 of the plating enhancing layer is cleaned. In an embodiment, the first region 23 is roughened through laser treatment with the laser beam 30. In a particular embodiment, the first region 23 is lightly laser-etched on the surface 22 of the non-wetting layer to roughen this first region 23. In an embodiment, the laser beam is slightly absorbed into the non-wetting layer to roughen the surface 22 to facilitate metal deposition and adhesion in the first region 23. In an embodiment, the first region 23 of the layer 20 at the surface 22 is laser-removed to allow plating therein. In an embodiment, the plating enhancing layer 20 undergoes laser-assisted activation that can facilitate selective metallization by catalyzing a chemical metallization bath process, as discussed in more detail below.

In an embodiment, the second region 24 that is not exposed to laser treatment substantially resists metal deposition. In an embodiment, the plating enhancing layer 20 substantially prevents spontaneous deposition of plating in the second region 24, and/or unwanted regions, and/or areas not exposed to laser treatment.

In an embodiment, the depth of the laser-roughened area or trench depends upon the depth of the conductive traces to be formed, and the application for which the substrate circuitry is being used. In an embodiment, the roughness of the laser-treated surface in the first region 23 is about 1 micron. In an embodiment, the laser is able to etch or roughen to a tolerance of about 1 micron, and the tolerance can more particularly be from about 0.1 to about 0.5 microns. In an embodiment, the trace width is about 12 microns to about 23 microns. However, trace widths outside of this range are within the scope of embodiments. In an embodiment, the spacing between adjacent first regions 23 (or conductive traces) is about 9 microns. In embodiments, spacing can be as low as about 1 micron to about 10 microns, depending upon electromigration in the intended use of the microelectronic device. In an embodiment, spacing of about one (1) micron between traces is possible if there is no interface between adjacent traces and traces are protected from electromigration.

In an embodiment, the laser beam is a line having a width in a range of about 4 microns to about 1000 microns wide. In an embodiment, the laser beam width corresponds to dimensions of a conductive trace 60 that is plated on the substrate 10. In an embodiment, the depth of the laser beam cut is controlled by the beam intensity, time, and number of laser pulses. In an embodiment, the depth of the cut is controlled by using a wavelength that is strongly absorbed by the plating enhancing layer 20, and less strongly absorbed by adjacent layers.

In an embodiment, the laser is at least one of an excimer laser, including a KrF laser, a YAG laser, a $CO_2$ laser, or another laser that is suitable for these purposes. In a particular embodiment, the laser is a KrF laser with a wavelength of about 248 nm, with a fluence of about 450 mJ/cm2, and that uses about 50 laser pulses. However, various ranges of each of these laser characteristics are within the scope of embodiments, and depend upon the application of the substrate and the conductive trace characteristics.

In an embodiment, the fluence of the laser is above a threshold that is determined for each material and laser wavelength. In an embodiment, the number of shots used for a particular depth is determined for each material and laser wavelength. In an embodiment, the fluence and the number of shots or laser pulses that are fired used corresponds to the maximum efficiency in terms of cost and time. In an embodiment, the fluence is in a range of between about 50 and about 1000 $mJ/cm^2$ and shots might range from about 1 to about 1000 laser pulses, although fluence and shots outside this range are within the scope of embodiments.

The particular specifications of the laser depend on the material used in the plating enhancing layer and depend upon a depth of removal of the plating enhancing layer. For example, in an embodiment, the particular specifications of the laser are different for a lightly laser etched surface 22, as compared with removal of an entire depth of the layer, thereby forming a trench in the plating enhancing layer (as discussed in more detail in the embodiments of FIGS. 2A and 2B).

Figure 1B:
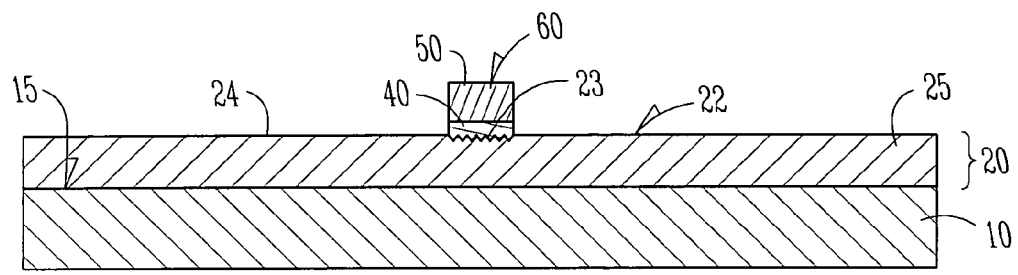
FIG. 1B is a cross-sectional view illustrating plating of the substrate of FIG. 1A in an embodiment.

FIG. 1B is a cross-sectional view illustrating plating of the substrate of FIG. 1A in an embodiment at 220. In an embodiment, the plating includes electroplating. In an embodiment, the plating includes electroless plating. In an embodiment, the plating includes a seed layer 40 and/or a plating layer 50. In a particular embodiment, the plating includes catalytic nucleation for deposition of the metal seed layer 40, then metal deposition of the plating layer 50 using a chemical and/or electroplating method. In an embodiment, the seed layer 40 and/or the plating layer 50 are supported in the laser-roughened region 23. In an embodiment, the seed layer 40 includes a catalytic metal.

In an embodiment, the seed layer 40 is about 0.5 micron thick, and can be in a range of about 0.1 or 0.2 micron thick to about 100 microns thick. In an embodiment, the width of the seed layer 40 corresponds to the width of the first region 23. In an embodiment, the width of the seed layer is less than about 50 microns. In an embodiment, the width of the seed layer is less than about 20 microns. In a particular embodiment, the width of the seed layer is about 17 microns. However, dimensions for the thickness and width outside of these ranges are within the scope of embodiments. In an embodiment, along a length of the seed layer, edges are substantially high quality and straight with a substantially high degree of accuracy.

In an embodiment, the laser-roughened coated substrate is dipped into a first electroless metal deposition seeding solution to have the seed layer 40 deposited in the laser-roughened regions 23. In an embodiment, metals are applied to the first region 23 by reduction of a metal salt solution to form the seed layer 40.

In an embodiment, the seed layer 40 includes at least one of palladium, platinum, gold, silver, a reducing agent tin, two types of materials including a metal that starts reduction and a catalytic material, a metal that starts reduction such as $Sn2+$ that oxidizes to $Sn4+$, a precious metal, a material that substantially adheres to an underlying surface, a material with an autocatalytic action with a plating solution, and a material with reducing properties. In an embodiment, the seed layer 40 includes at least one of copper and nickel. In an embodiment, the copper and nickel are pure, such as vacuum deposited. In an embodiment where pure copper or pure nickel is used as the seed layer, tin is not additionally used.

In an embodiment, the laser-roughened substrate is dipped into a second electroless metal deposition seeding solution (or bath) to have metal deposited in the roughened region 23 to form the metal plating layer 50. In an embodiment, the metal plating layer is formed over the seed layer 40.

In an embodiment, the plating layer 50 includes at least one of copper, nickel, gold, tantalum, tungsten, titanium, chromium, silver, a material that conducts, a material that tends not to substantially oxidize, and a substantially adhesive material.

Figure 2A:
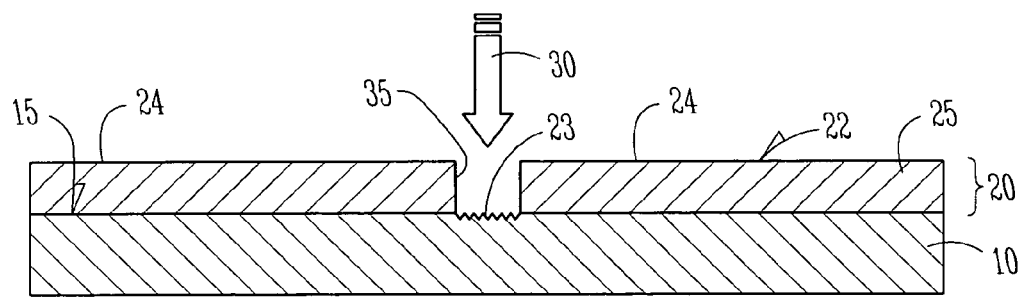
FIG. 2A is a cross-sectional view illustrating laser-treatment of a substrate in an embodiment.

FIG. 2A is a cross-sectional view illustrating laser-treatment of the substrate 10 in an embodiment. The plating enhancing layer 20 has the surface 22 with the first region 23 and the second region 24, in an embodiment. In an embodiment, the conductive trace 60 or the metal trace is supported by the plating enhancing layer 20 at the first region 23 (or supported by the substrate if the plating enhancing layer is later removed), as discussed herein. In an embodiment, the plating enhancing layer 20 includes the non-wetting layer 25.

In an embodiment, a process includes a means for roughening the first region 23. In another embodiment, the process includes a means for forming a trench 35 in the first region 23. In an embodiment, the means for roughening and the means for forming the trench 35 in the first region of the coated surface may include laser-treating the first region.

In this embodiment shown, the laser treatment via the laser beam 30 forms the trench 35 in the first region 23 through the non-wetting layer 25 to the substrate 10. In an embodiment, the substrate 10 has a surface 15 that is exposed to the laser beam 30 and roughened. In an embodiment, the laser beam 30 is slightly absorbed into the substrate 10 to roughen the surface 15 to enable better metal deposition and adhesion. In an embodiment, the substrate includes a material that is plateable and/or has substantially plateable characteristics.

Figure 2B:
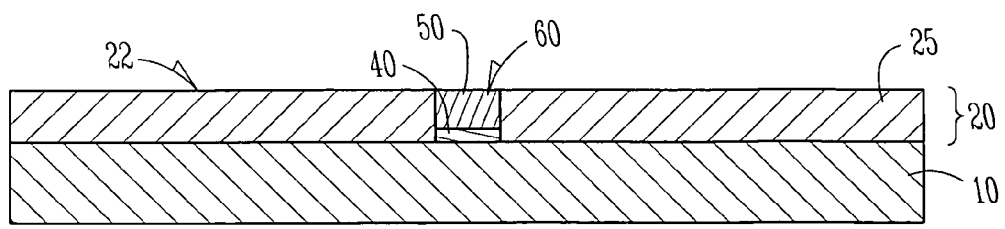
FIG. 2B is a cross-sectional view illustrating plating of the substrate of FIG. 2A in an embodiment.

FIG. 2B is a cross-sectional view illustrating plating of the substrate 10 of FIG. 2A in an embodiment. In an embodiment, the laser-roughened substrate surface 15 in FIG. 2A is electroless plated. In an embodiment, the substrate surface is electroplated. In an embodiment, plating of the laser-roughened substrate surface includes plating with the seed layer 40 and the plating layer 50. In an embodiment, the seed layer 40 and the plating layer 50 are formed substantially within the trench 35. In the embodiment shown, at least the plating layer 50 forms the trace 60.

Figure 2C:
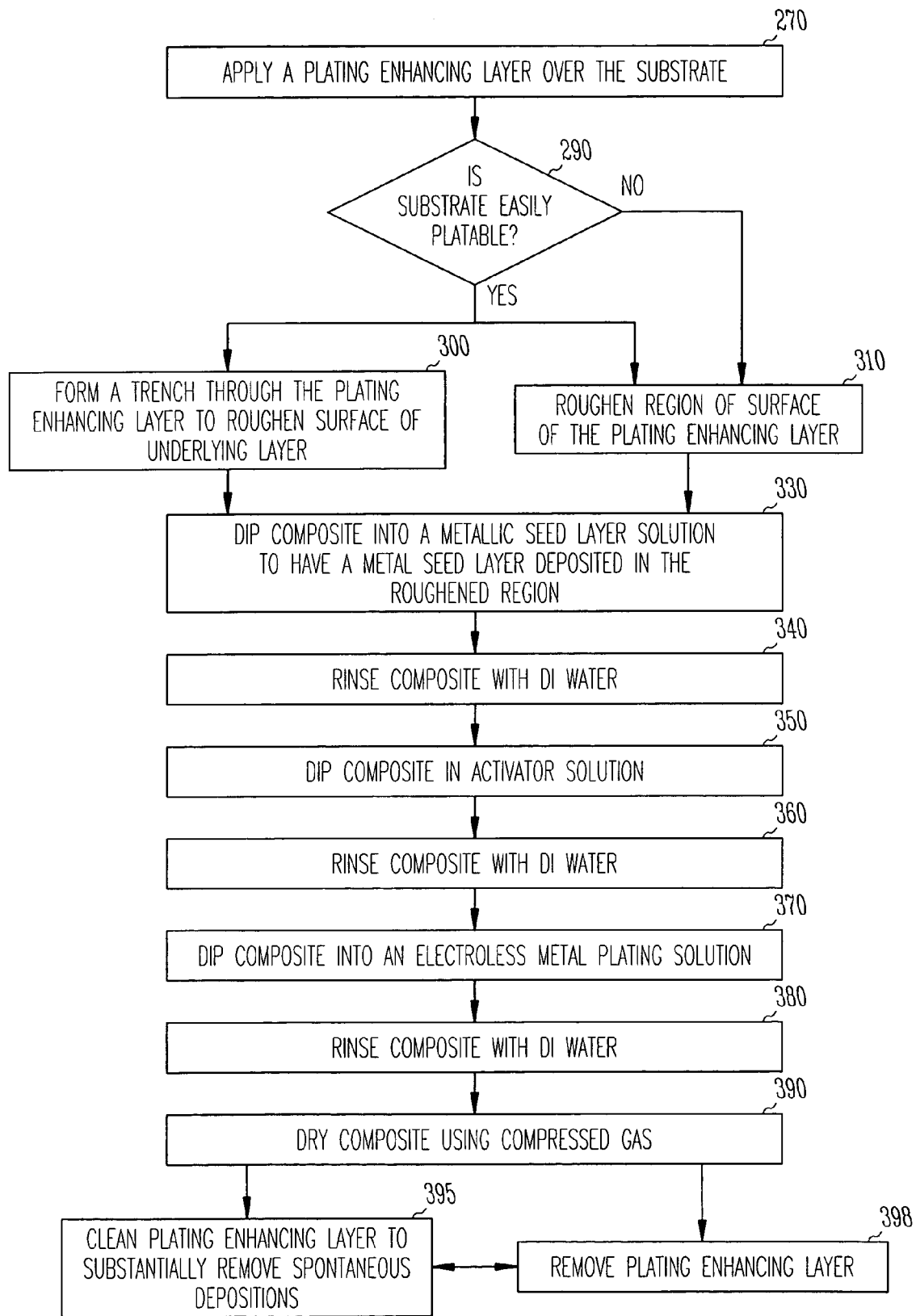
FIG. 2C is a flow chart illustrating embodiments of plating of the substrates in FIGS. 1A and 2A.

FIG. 2C is a flow chart illustrating embodiments of plating of the substrates in FIGS. 1A and 2A. In FIG. 2C, at 270, the plating enhancing layer 20 is supported by and/or applied over the substrate 10, as illustrated in FIGS. 1A and 2A. The plating enhancing layer 20 can have any number of layers, depending on the application.

At 290 is a decision in the process as to whether or not the substrate is easily plateable. If the substrate is easily plateable, then either 300 or 310 is decided, depending upon the application of the substrate. If the substrate is not easily plateable, then the chart directs toward 310. At 300, the trench 35 is formed through the plating enhancing layer 20 to roughen a region of the surface of the layer underlying the plating enhancing layer 20, as shown for example in FIG. 2A. At 310, the first region 23 at the surface 22 of the plating enhancing layer 20 is roughened.

After 300 or 310, the composite substrate is dipped into a seed layer solution at 330 to have the seed layer 40 over the roughened region(s). In an embodiment, the solution is a palladium seed layer solution. In an embodiment, the substrate is dipped for about 60 seconds. The timing may be varied in different embodiments.

At 340, excess solution is removed from the composite substrate using chemical and/or mechanical processes. For example, the composite substrate is rinsed with deionized (DI) water, in an embodiment. In an embodiment, after the composite substrate is rinsed with DI water, the composite substrate is wiped with a cloth. Instead of rinsing with DI water, or in addition to rinsing with DI water, excess solution is removed from the composite substrate using at least one of various chemical or mechanical process.

At 350, the composite substrate is dipped in an activator solution for about 60 seconds, in an embodiment. The timing may be varied in different embodiments.

At 360, excess solution is removed from the composite substrate, for example by rinsing the composite substrate with deionized water, in an embodiment. In an embodiment, after the composite substrate is rinsed with DI water, the composite substrate is wiped with a cloth. Instead of rinsing with DI water, or in addition to rinsing with DI water, excess solution is removed from the composite substrate using at least one of various chemical or mechanical process. In some embodiments, removing at 340, dipping at 350, and removing at 360 may be skipped.

At 370, the composite substrate is dipped into an electroless plating solution to form the plating layer 50 over the seed layer 40. In an embodiment, the solution includes a copper electroless plating solution. In an embodiment, the composite substrate is dipped for about 120 seconds, although timing may be varied in different embodiments.

At 380, excess solution is removed from the composite substrate, for example by rinsing the composite substrate with deionized water, in an embodiment. In an embodiment, after the composite substrate is rinsed with DI water, the composite substrate is wiped with a cloth. Instead of rinsing with DI water, or in addition to rinsing with DI water, excess solution is removed from the composite substrate using at least one of various chemical or mechanical process.

At 390, the composite substrate is dried using compressed gas, in an embodiment. In an embodiment, the compressed gas includes nitrogen, although other gases may be used in different embodiments. In an embodiment, the composite substrate is not dried using a compressed gas at 390.

At 395, in an embodiment, the plating enhancing layer is cleaned to remove extraneous plating and/or spontaneous depositions. In an embodiment, the cleaning includes at least one of an ultrasonic bath, solvent, acid, and base.

At 398, in an embodiment, the plating enhancing layer 20 is removed. In an embodiment, the layer 20 is removed to remove extraneous plating and/or spontaneous depositions. In an embodiment, the layer 20 is removed if the layer is potentially a nuisance and/or if the plating enhancing layer 20 includes metal. In some embodiments, rinsing at 380, drying at 390, cleaning at 395 and removing at 398 may be skipped. In other embodiments, if cleaning at 395 is performed substantially successfully, removing at 398 is not performed. In yet other embodiments, cleaning at 395 is skipped and removing at 398 is performed instead.

Figure 3A:
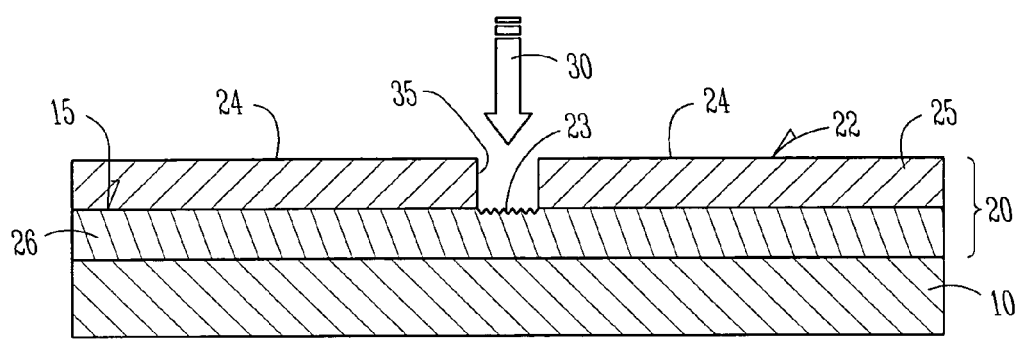
FIG. 3A is a cross-sectional view illustrating laser-treatment of a substrate in an embodiment.

FIG. 3A is a cross-sectional view illustrating laser-treatment of the substrate 10 in an embodiment. In an embodiment, the plating enhancing layer 20 is supported by the substrate 10. The plating enhancing layer 20 has the surface 22 with the first region 23 and the second region 24, in an embodiment. In an embodiment, the conductive trace 60 or the metal trace is supported by the plating enhancing layer 20 at the first region 23 (or supported by the substrate if the plating enhancing layer is later removed), as discussed herein. The plating enhancing layer 20 includes the non-wetting layer 25 and a base coat 26 between the non-wetting layer 25 and the substrate 10, in an embodiment. In an embodiment, the laser beam 30 is directed towards the first region 23 of the plating enhancing layer 20 to form the trench 35 through the non-wetting layer to roughen a surface of the base coat 26.

In an embodiment, the base coat 26 is formed of a polymer material. In an embodiment, the base coat 26 includes at least one of the following characteristics: substantially plateable, substantially wetting, substantially smooth, substantially defect-free, substantially attractive to adjacent layers, including being substantially resistant to peeling and substantially adhering to the substrate, substantially inexpensive, substantially long-term environmentally stable, substantially similar thermal coefficient of expansion compared with adjacent materials, and substantially chemically compatible with adjacent surfaces and an external environment.

In an embodiment, the base coat 26 is supported by the substrate when the substrate includes a non-wetting characteristic. In an embodiment, the base coat 26 is supported by the substrate when the substrate includes a non-plateable characteristic. In an embodiment, the base coat 26 is supported by the substrate when the substrate includes a characteristic of not substantially adhering to metal, even after the substrate surface is exposed to laser treatment.

In an embodiment, the base coat includes a laminated film. In an embodiment, the base coat has a thickness of about 0.1 microns to about 150 microns. In a particular embodiment, the base coat thickness is about 0.5 microns to about 100 microns. In a more particular embodiment, the base coat thickness is less than 25 microns. However, base coat thicknesses outside of these ranges are possible, and depend upon the application. In an embodiment, the base coat layer 26 is a plasma-deposited thin film layer. However, other deposition methods are possible, and depend upon the application.

Figure 3B:
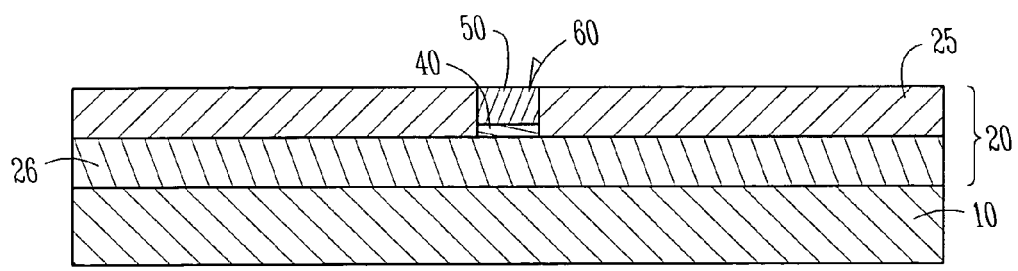
FIG. 3B is a cross-sectional view illustrating plating of the substrate of FIG. 3A in an embodiment.

FIG. 3B is a cross-sectional view illustrating plating of the substrate 10 of FIG. 3A in an embodiment. In the embodiment of FIG. 3B, the laser-roughened surface of the base layer 26 in FIG. 3A is electroless plated. In an additional embodiment, the surface of the base layer 26 surface is not substantially laser-roughened. In this additional embodiment, a region of the top non-wetting layer (25) is removed to expose the surface of the base coat for electroplating. In an embodiment, the surface of the base layer is electroplated. In an embodiment, plating of the base layer surface includes plating with the seed layer 40 and the plating layer 50. In an embodiment, the seed layer 40 and the plating layer 50 are deposited in the manner described with respect to FIG. 2C. In an embodiment, the seed layer 40 and the plating layer 50 are formed substantially within the trench 35. In the embodiment shown, at least the plating layer 50 forms the trace 60. In the embodiment shown, the trace 60 is substantially within the trench 35. However, other embodiments where the trace 60 protrudes from or is beneath the surface of the plating enhancing surface are also possible.

In an embodiment, a means for electroplating a substantially non-plateable surface 15 of the substrate 10 includes coating the substantially non-plateable surface of the substrate, laser-roughening a region 23 of the coating, and electroplating the laser-roughened region. In an embodiment, the coating includes the plating enhancing layer 20. In a particular embodiment, the coating includes the base coat 26 and/or the non-wetting layer. In an embodiment, the laser-roughened region includes the laser-roughened surfaces of the plating enhancing layer 20 and/or the laser-roughened trenches within the plating enhancing layer 20.

Figure 4A:
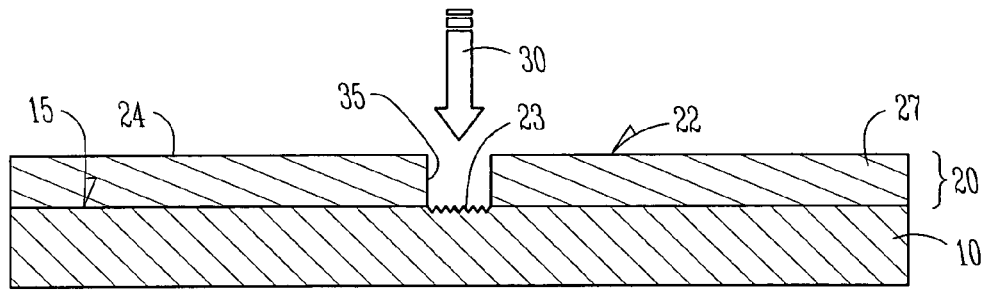
FIG. 4A is a cross-sectional view illustrating laser-treatment of a substrate in an embodiment.

FIG. 4A is a cross-sectional view illustrating laser-treatment of the substrate 10 in an embodiment. In an embodiment, the plating enhancing layer 20 is supported by the substrate 10. The plating enhancing layer 20 has the surface 22 with the first region 23 and the second region 24, in an embodiment. In an embodiment, the conductive trace 60 or the metal trace is supported by the plating enhancing layer 20 at the first region 23 (or supported by the substrate if the plating enhancing layer is later removed), as discussed herein. In an embodiment, the plating enhancing layer 20 includes a sacrificial layer 27 supported by the substrate 10.

A laser beam 30 is directed towards the plating enhancing layer 20 to laser roughen the first region 23. In an embodiment, the trench 35 through the sacrificial layer is formed by the laser-treatment. In an embodiment, the underlying substrate surface 15 is laser-roughened. The laser beam is slightly absorbed into the substrate surface 15 to roughen the surface and to facilitate metal deposition and adhesion.

In an embodiment, the sacrificial layer 27 has a thickness in the range of about 0.5 micron to about 5 micron. In an embodiment, the thickness is less than 25 microns. However, in an embodiment, the range of thickness may be 0.1 micron to 100 micron, or outside of this, depending upon the application.

In an embodiment, the sacrificial layer 27 includes a soluble polymer. In an embodiment, the sacrificial layer 27 is at least one of a plasma-deposited thin film layer, a photodegradable polymer, a ceramic material, a loosely-adhered ceramic to be broken for removal, a loosely-adhered ceramic to be readily broken down in an ultra sonic bath, having a minimal coating of metal, easy to remove, thin, leaving substantially little on the underlying surface when removed, substantially inexpensive, colored to see remaining sacrificial layer on the underlying surface, and substantially environmentally friendly. In an embodiment, the sacrificial layer 27 is able to be peeled off of an underlying supporting layer.

Figure 4B:
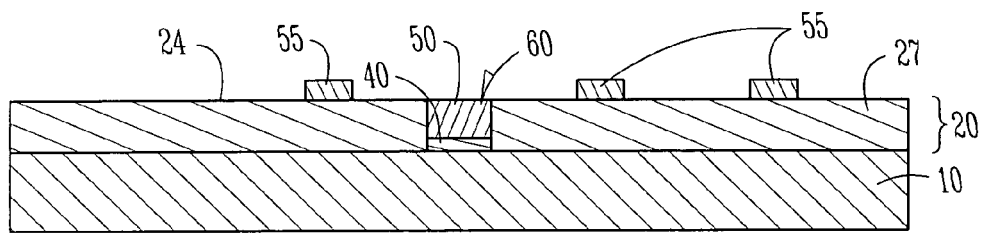
FIG. 4B is a cross-sectional view illustrating plating of the substrate of FIG. 4A in an embodiment.

FIG. 4B is a cross-sectional view illustrating plating of the substrate of FIG. 4A in an embodiment. In an embodiment, the seed layer 40 and the plating layer 50 are deposited in the manner described with respect to FIG. 2C. In an embodiment, spontaneous metal plating 55 is supported by the second region 24 of the plating enhancing layer 20. In an embodiment, the spontaneous metal plating 55 is formed of at least one of the seed layer 40 and the plating layer 50.

Figure 4C:
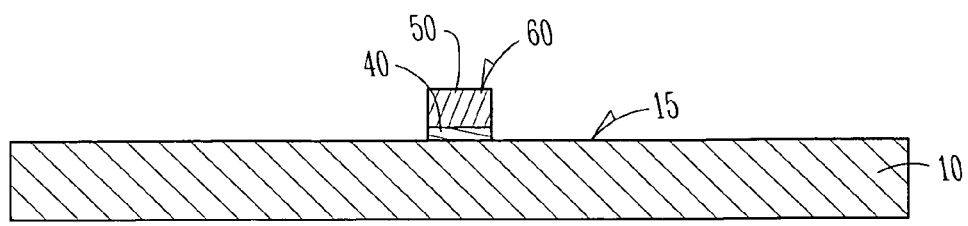
FIG. 4C is a cross-sectional view illustrating spontaneous plating removed from the substrate of FIG. 4B in an embodiment.

FIG. 4C is a cross-sectional view illustrating the spontaneous plating removed 55 from the substrate 10 of FIG. 4B in an embodiment. In the embodiment shown, the sacrificial layer 27 of the plating enhancing layer 20 is removed and with the layer 27, the spontaneous metal plating 55 is also removed. In an embodiment, the layer 27 is removed with a solvent, although the layer 27 may be removed by any means, depending upon the application. In the embodiment shown, at least the plating layer 50 forms the trace 60. In an embodiment, when the sacrificial layer 27 is removed, the trace 60 protrudes or extends from the surface 15 of the substrate 10.

In an embodiment, the sacrificial layer 27 is applied via a solvent and/or applied via film lamination, although other application methods are within embodiments, depending upon the application.

In an embodiment, the sacrificial layer 27 is used when post cleaning does not remove spontaneous deposition 55 of electroplating materials.

In an embodiment, a process includes a means for substantially preventing spontaneous deposition 55 of electroplating materials in the second region 24 of the coated surface or plating enhancing layer 20. In an embodiment, the means for substantially preventing spontaneous deposition of electroplating materials in the second region 24 include laser-treating the first region 23 and not the second region 24 of the plating enhancing layer 20, removing at least a portion of the plating enhancing layer 20, coating the substrate with a non-plateable material, and/or cleaning the substrate surface 15 or the plating enhancing layer surface 22.

Figure 5A:
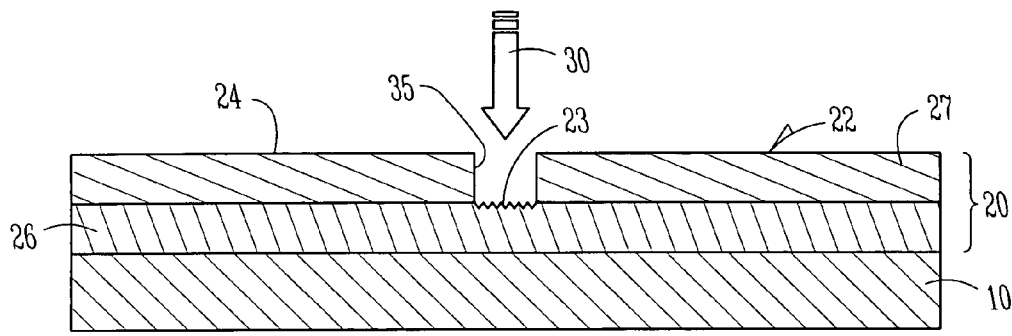
FIG. 5A is a cross-sectional view illustrating laser-treatment of a substrate in an embodiment.

FIG. 5A is a cross-sectional view illustrating laser-treatment of the substrate 10 in an embodiment. In an embodiment, the plating enhancing layer 20 is supported by the substrate 10. The plating enhancing layer 20 has the surface 22 with the first region 23 and the second region 24, in an embodiment. In an embodiment, the conductive trace 60 or the metal trace is supported by the plating enhancing layer 20 at the first region 23 (or supported by the substrate if the plating enhancing layer is later removed), as discussed herein. The plating enhancing layer 20 includes the sacrificial layer 27 and the base coat 26 between the layer 27 and the substrate 10, in an embodiment. In an embodiment, the laser beam 30 is directed towards the first region 23 of the plating enhancing layer 20 to form the trench 35 through the sacrificial layer 27 to roughen the surface of the base coat 26. In an embodiment, the laser beam 30 is slightly absorbed into the surface of the base coat layer to roughen the surface to facilitate metal deposition and adhesion.

Figure 5B:
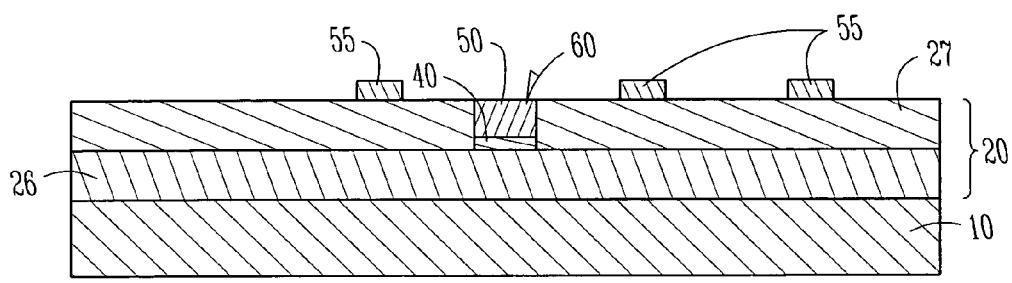
FIG. 5B is a cross-sectional view illustrating plating of the substrate of FIG. 5A in an embodiment.

FIG. 5B is a cross-sectional view illustrating plating of the substrate of FIG. 5A in an embodiment. In an embodiment, the seed layer 40 and the plating layer 50 are deposited in the manner described with respect to FIG. 2C. In an embodiment, spontaneous metal plating 55 is supported by the second region 24 of the plating enhancing layer 20.

Figure 5C:
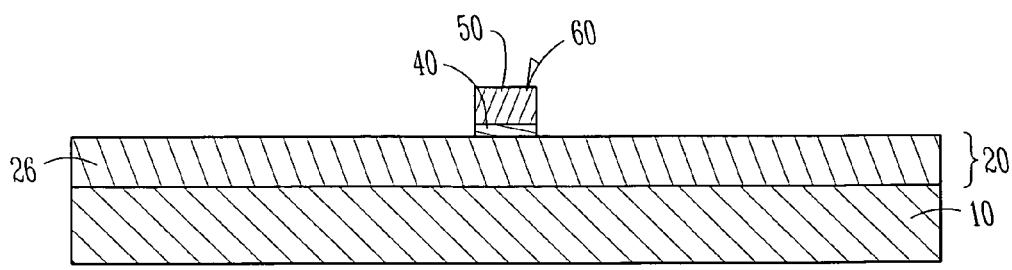
FIG. 5C is a cross-sectional view illustrating spontaneous plating removed from the substrate of FIG. 5B in an embodiment.

FIG. 5C is a cross-sectional view illustrating spontaneous plating removed 55 from the substrate 10 of FIG. 5B in an embodiment. In the embodiment shown, the sacrificial layer 27 of the plating enhancing layer 20 is removed and with the layer 27, the spontaneous metal plating 55 is also removed. In an embodiment, the layer 27 is removed with a solvent, although the layer 27 may be removed by any means, depending upon the application. In the embodiment shown, at least the plating layer 50 forms the trace 60. In an embodiment, when the sacrificial layer 27 is removed, the trace 60 protrudes or extends from the surface of a remaining portion (layer 26) of the plating enhancing layer 20.

Figure 6A:
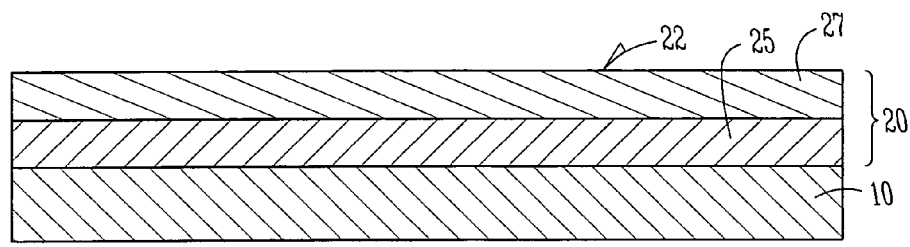
FIG. 6A is a cross-sectional view illustrating a substrate in an embodiment.

FIG. 6A is a cross-sectional view illustrating the substrate 10 in an embodiment. In an embodiment, the plating enhancing layer 20 is supported by the substrate 10. The plating enhancing layer 20 has the surface 22 with the first region 23 and the second region 24, in an embodiment. In an embodiment, the conductive trace 60 or the metal trace is supported by the plating enhancing layer 20 at the first region 23 (or supported by the substrate if the plating enhancing layer is later removed), as discussed herein. The plating enhancing layer 20 includes the sacrificial layer 27 and the non-wetting layer 25 between the layer 27 and the substrate 10, in an embodiment.

Figure 6B:
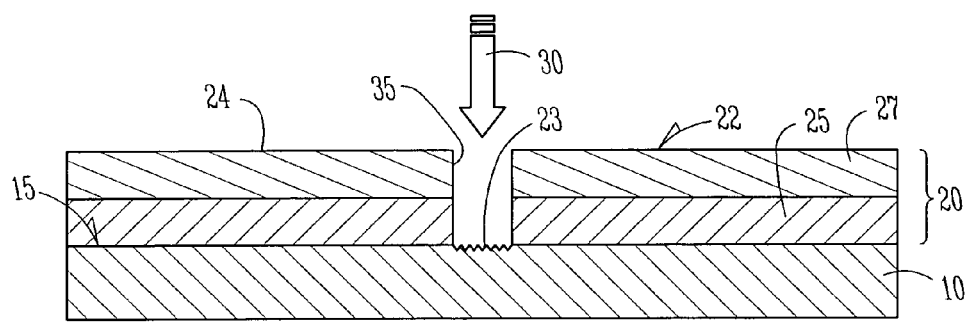
FIG. 6B is a cross-sectional view illustrating laser-treatment of the substrate of FIG. 6A in an embodiment.

FIG. 6B is a cross-sectional view illustrating laser-treatment of the substrate 10 of FIG. 6A in an embodiment. In an embodiment, the laser beam 30 is directed towards the first region 23 of the plating enhancing layer 20 to form the trench 35 through the sacrificial layer 27 and the non-wetting layer 25 to roughen the surface of the substrate 10. In an embodiment, the laser beam 30 is slightly absorbed into the surface of the substrate 10 to roughen the surface to facilitate metal deposition and adhesion. In an additional embodiment, the substrate surface is not laser-roughened. In an embodiment, the substrate surface is substantially plateable without laser-roughening.

Figure 6C:
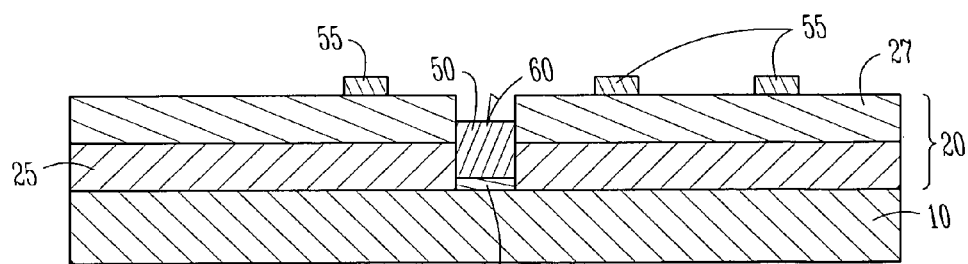
FIG. 6C is a cross-sectional view illustrating plating of the substrate of FIG. 6B in an embodiment.

FIG. 6C is a cross-sectional view illustrating plating of the substrate of FIG. 6B in an embodiment. In an embodiment, the seed layer 40 and the plating layer 50 are deposited in the manner described with respect to FIG. 2C. In an embodiment, spontaneous metal plating 55 is supported by the second region 24 of the plating enhancing layer 20.

Figure 6D:
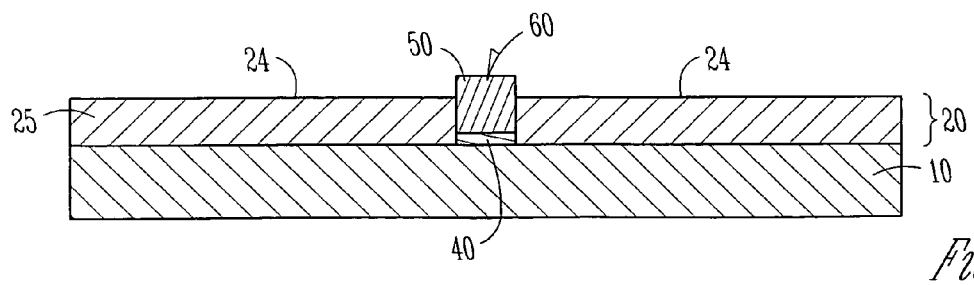
FIG. 6D is a cross-sectional view illustrating spontaneous plating removed from the substrate of FIG. 6C in an embodiment.

FIG. 6D is a cross-sectional view illustrating spontaneous plating removed 55 from the substrate 10 of FIG. 6C in an embodiment. In the embodiment shown, the sacrificial layer 27 of the plating enhancing layer 20 is removed and with the layer 27, the spontaneous metal plating 55 is also removed. In an embodiment, the layer 27 is removed with a solvent, although the layer 27 may be removed by any means, depending upon the application. In the embodiment shown, at least the plating layer 50 forms the trace 60. In an embodiment, when the sacrificial layer 27 is removed, the trace 60 protrudes or extends from a remaining portion (layer 25) of the plating enhancing layer 20. In an embodiment, the surface of the plating enhancing layer 20 is cleaned, instead of or in addition to removal of a portion of the plating enhancing layer 20.

Figure 7A:
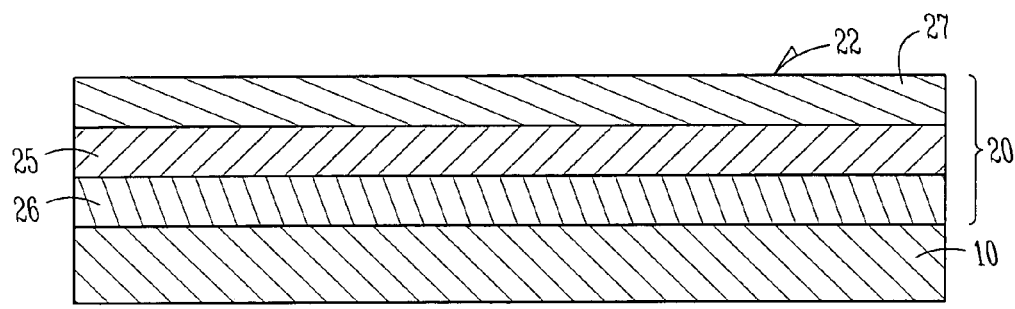
FIG. 7A is a cross-sectional view illustrating a substrate in an embodiment.

FIG. 7A is a cross-sectional view illustrating the substrate 10 in an embodiment. In an embodiment, the plating enhancing layer 20 is supported by the substrate 10. The plating enhancing layer 20 has the surface 22 with the first region 23 and the second region 24, in an embodiment. In an embodiment, the conductive trace 60 or the metal trace is supported by the plating enhancing layer 20 at the first region 23 (or supported by the substrate if the plating enhancing layer is later removed), as discussed herein. The plating enhancing layer 20 includes the sacrificial layer 27, the non-wetting layer 25, and the base coat 26 adjacent the substrate 10, with the non-wetting layer 25 between the sacrificial layer 27 and the base coat 26, in an embodiment.

Figure 7B:
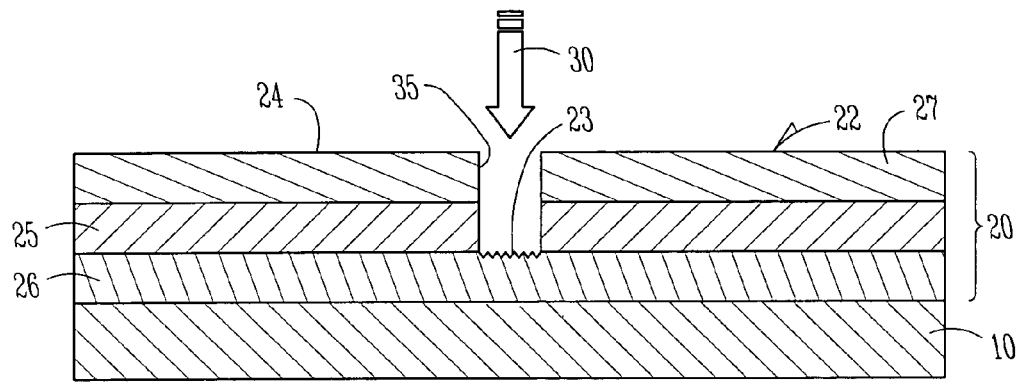
FIG. 7B is a cross-sectional view illustrating laser-treatment of the substrate of FIG. 7A in an embodiment.

FIG. 7B is a cross-sectional view illustrating laser-treatment of the substrate 10 of FIG. 7A in an embodiment. In an embodiment, the laser beam 30 is directed towards the first region 23 of the plating enhancing layer 20 to form the trench 35 through the sacrificial layer 27 and the non-wetting layer 25 to roughen the surface of the base coat 26. In an embodiment, the laser beam 30 is slightly absorbed into the surface of the base coat layer 26 to roughen the surface to facilitate metal deposition and adhesion.

Figure 7C:
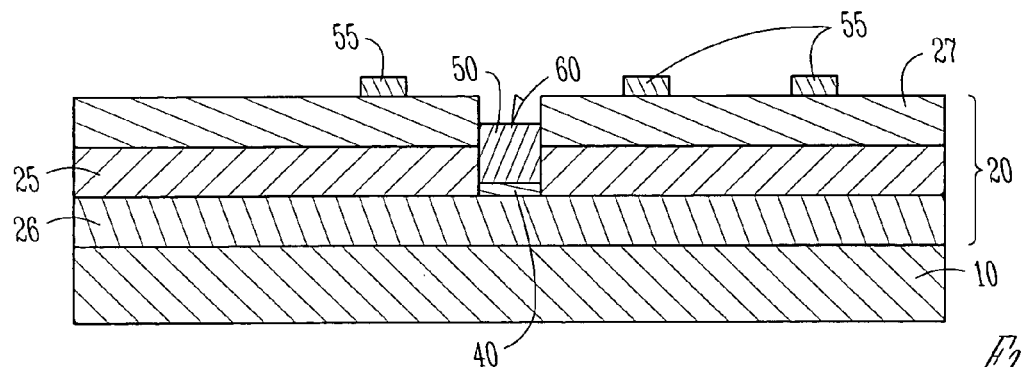
FIG. 7C is a cross-sectional view illustrating plating of the substrate of FIG. 7B in an embodiment.

FIG. 7C is a cross-sectional view illustrating plating of the substrate of FIG. 7B in an embodiment. In an embodiment, the seed layer 40 and the plating layer 50 are deposited in the manner described with respect to FIG. 2C. In an embodiment, spontaneous metal plating 55 is supported by the second region 24 of the plating enhancing layer 20.

Figure 7D:
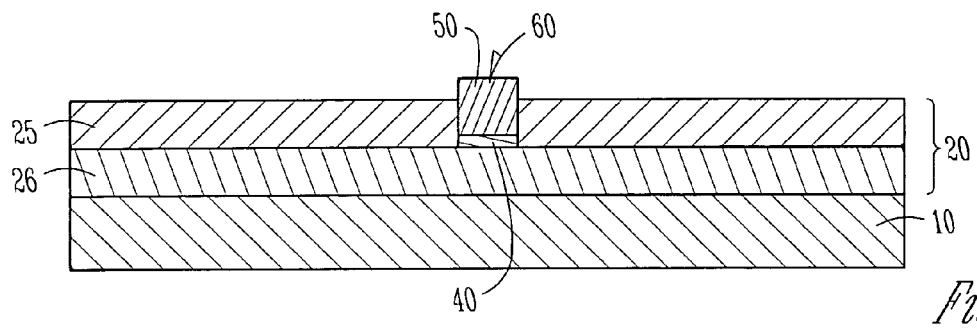
FIG. 7D is a cross-sectional view illustrating spontaneous plating removed from the substrate of FIG. 7C in an embodiment.

FIG. 7D is a cross-sectional view illustrating spontaneous plating removed 55 from the substrate 10 of FIG. 7C in an embodiment. In the embodiment shown, the sacrificial layer 27 of the plating enhancing layer 20 is removed and with the layer 27, the spontaneous metal plating 55 is also removed. In an embodiment, the layer 27 is removed with a solvent, although the layer 27 may be removed by any means, depending upon the application. In the embodiment shown, at least the plating layer 50 forms the trace 60. In an embodiment, when the sacrificial layer 27 is removed, the trace 60 protrudes or extends from a remaining portion (the non-wetting layer 25) of the plating enhancing layer 20.

Figure 7E:
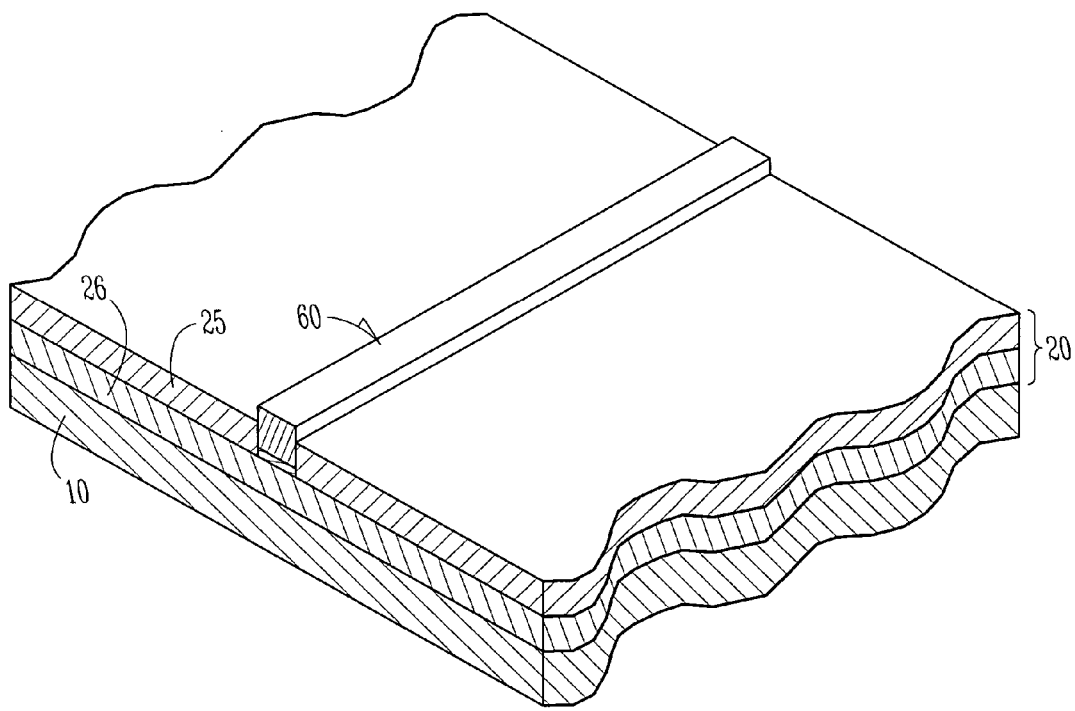
FIG. 7E is a perspective cross-sectional view of the substrate of FIG. 7D in an embodiment.

FIG. 7E is a perspective cross-sectional view of the substrate 10 of FIG. 7D in an embodiment.

Figure 8:
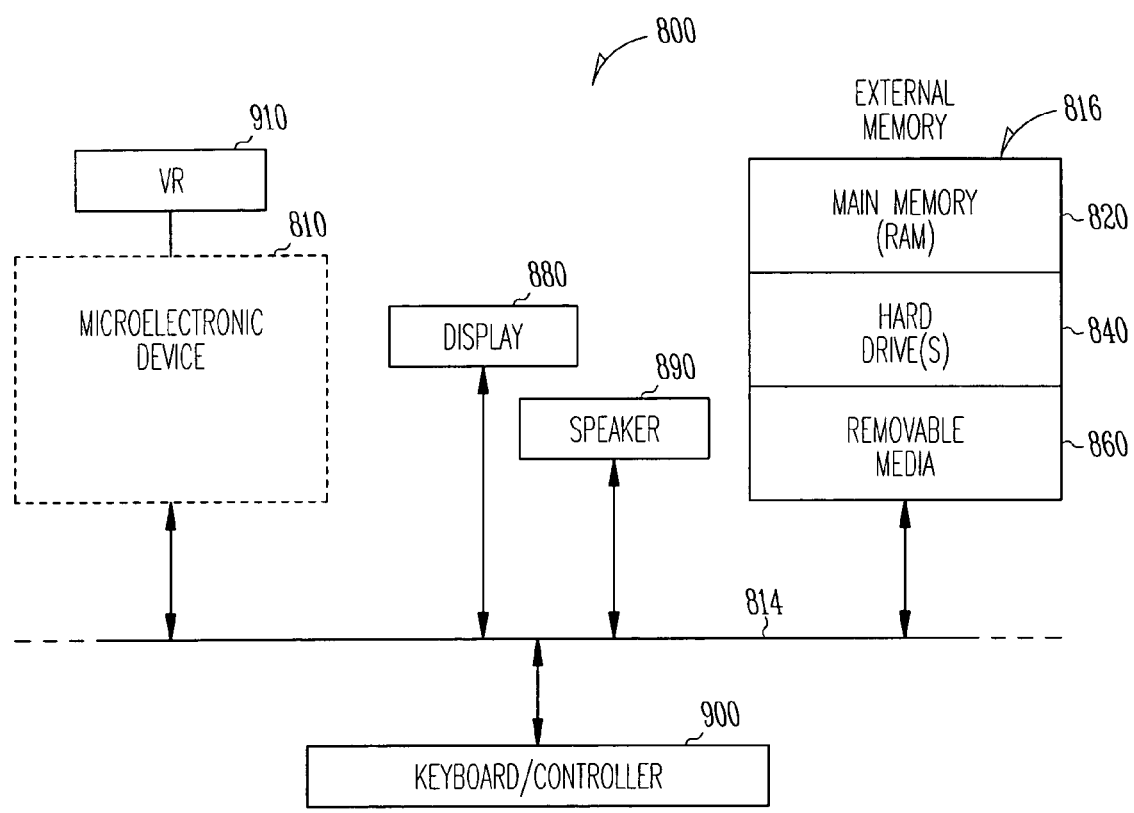
FIG. 8 is a block diagram of an embodiment of an electronic system that includes a microelectronic device.

FIG. 8 is a block diagram of an electronic system 800, such as a computer system, that includes a microelectronic device 810 which is electrically coupled to various components in electronic system 800 via a system bus 814. Any of the electroplated substrates described herein may form at least a part of the microelectronic device 810 that may be electrically coupled to the system bus 814 in an embodiment.

Microelectronic device 810 may include a semiconducting device, a microprocessor, a microcontroller, a graphics processor or a digital signal processor, memory, flash memory and/or a custom circuit or an application-specific integrated circuit, such as a communications circuit and similar electronic systems. The system bus 814 may be a single bus or any combination of buses.

The electronic system 800 may also include an external memory 816 that in turn includes one or more memory elements suitable to the particular application. The electronic system 800 may also include a display device 880, a speaker 890, and a controller 900, such as a keyboard, mouse, trackball, game controller, microphone, voice-recognition device, or any other device that inputs information into the electronic system 800.

In some embodiments, electronic system 800 may further include a voltage source 910 that is electrically coupled to microelectronic device 810. Voltage source 910 may be used to supply power one or more of the dice that are stacked within semiconducting device 810.

Microelectronic device 810 can be implemented in a number of different embodiments. The elements, materials, geometries, dimensions, and sequence of operations can all be varied to suit particular applications. Parts of some embodiments may be included in, or substituted for, those of other embodiments. Various embodiments also could be used in conjunction with various types of electronic assemblies, such as printed circuit (PC) boards or other electronic circuit housings and is not meant to be limited in use. The illustrations of embodiments described herein are intended to provide a general understanding of the structure of various embodiments, and they are not intended to serve as a complete description of all the elements and features of apparatus and systems that might make use of the structures described herein. Applications that may include the apparatus and systems of various embodiments include electronic circuitry used in printers, fluid ejection pen bodies, ink jet cartridges, microelectronic devices, electronic displays, large area interconnects, circuit boards, flexible printed circuits, rugged military electronics with no separate components, contact pads or switches, and all types of consumer electronics including high-speed computers, communication and signal processing circuitry, modems, processors, and application-specific modules, including multilayer, multi-chip modules. Such apparatus and systems may further be included as sub-components within a variety of electronic systems, such as televisions, cellular telephones, personal computers, personal digital assistants (PDAs), workstations, radios, video players, vehicles, and others.

FIGS. 1A to 8 are merely representational and are not drawn to scale. Certain proportions thereof may be exaggerated, while others may be minimized. Many other embodiments will be apparent to those of skill in the art upon reviewing the above description. Parts of some embodiments may be included in, or substituted for, those of other embodiments.

While the foregoing examples of dimensions and ranges are considered typical, the various embodiments are not limited to such dimensions or ranges. It is recognized that the trend within industry is to generally reduce device dimensions for the associated cost and performance benefits.

The accompanying drawings that form a part hereof show by way of illustration, and not of limitation, specific embodiments in which the subject matter may be practiced. Embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments have more features than are expressly recited in each claim. Thus the following claims are hereby incorporated into the Detailed Description, with each claim standing on its own as a separate embodiment.

It will be readily understood to those skilled in the art that various other changes in the details, material, and arrangements of the parts and method stages which have been described and illustrated in order to explain the nature of embodiments herein may be made without departing from the principles and scope of embodiments as expressed in the subjoined claims.

The invention claimed is:

1. A microelectronic device comprising:
   a substrate with a surface;
   a plating enhancing layer having a roughened region, said plating enhancing layer applied to the surface of the substrate, wherein the plating enhancing layer includes a sacrificial layer and a non-wetting layer, wherein the non-wetting layer includes at least one of a fluoropolymer, a poly(para-xylylene), Parylene, or a non-wetting polymer, and combinations thereof;
   a seed layer supported by the laser-roughened region; and
   a plating layer supported by the seed layer.

2. The microelectronic device of claim 1 wherein the plating layer forms a conductive trace.

3. The microelectronic device of claim 1 wherein the plating layer includes at least one of copper, nickel, gold, tantalum, tungsten, titanium, chromium, silver, a material that electrically conducts, a material that does not substantially oxidize, or an adhesive material and combinations thereof.

4. The microelectronic device of claim 1 wherein the seed layer includes at least one of palladium, platinum, gold, silver, copper, nickel, a tin reducing agent, two different types of materials including a metal that starts reduction and a catalytic material, a metal that starts reduction such as Sn2+ that oxidizes to Sn4+, a precious metal, a material that substantially adheres to an underlying surface, a material having an autocatalytic action when added to a plating solution, or a material that undergoes reduction and combinations of the above.

5. The microelectronic device of claim 1 wherein the plating enhancing layer is at least one of substantially non-wetting, substantially smooth, substantially defect-free, substantially adherent to an underlying surface, or a material with a substantially similar thermal coefficient of expansion as compared with adjacent materials.

6. The microelectronic device of claim 1 wherein the substrate is at least one of a polymer, a liquid crystal polymer (LCP), a glass filled LCP, a metal, silicon, or a ceramic material.

7. A method comprising:
   applying a plating enhancing layer to a surface of a substantially non-plateable substrate;
   laser-treating a region of the plating enhancing layer, the plating enhancing layer having a roughened region, wherein the plating enhancing layer includes a sacrificial layer and a non-wetting layer, wherein the non-wetting layer includes at least one of a fluoropolymer, a poly(para-xylylene), or a non-wetting polymer, and combinations thereof;

forming a seed layer in the laser-treated region, the seed layer supported by the laser roughened region; and forming a plating layer over the seed layer, the plating layer supported by the seed layer.

8. The method of claim 7 wherein the substrate surface is coated with a basecoat.

\* \* \* \* \*

UNITED STATES PATENT AND TRADEMARK OFFICE
CERTIFICATE OF CORRECTION

| | | |
|---|---|---|
| PATENT NO. | : 7,291,380 B2 | Page 1 of 1 |
| APPLICATION NO. | : 10/888450 | |
| DATED | : November 6, 2007 | |
| INVENTOR(S) | : Peter S. Nyholm et al. | |

It is certified that error appears in the above-identified patent and that said Letters Patent is hereby corrected as shown below:

In column 13, line 4, in Claim 7, after "(para-xylylene)," insert -- Parylene, --.

Signed and Sealed this

Eleventh Day of November, 2008

JON W. DUDAS
*Director of the United States Patent and Trademark Office*